US012732190B1

(12) United States Patent
Pfaff et al.

(10) Patent No.: US 12,732,190 B1
(45) Date of Patent: Sep. 8, 2026

(54) HIGH-SPEED OCTAL-RATE WIRELINE TRANSMITTERS

(71) Applicant: Synopsys, Inc., Sunnyvale, CA (US)

(72) Inventors: Dirk Pfaff, Ottawa (CA); Noman Hai, Mississauga (CA); Tom Eeckelaert, Kanata (CA); Muhammad Ahmed Nummer, Kanata (CA)

(73) Assignee: Synopsys, Inc, Sunnyvale, CA (US)

( * ) Notice: Subject to any disclaimer, the term of this patent is extended or adjusted under 35 U.S.C. 154(b) by 78 days.

(21) Appl. No.: 18/433,092

(22) Filed: Feb. 5, 2024

Related U.S. Application Data

(60) Provisional application No. 63/519,647, filed on Aug. 15, 2023.

(51) Int. Cl.

| | |
|---|---|
| ***H03K 19/173*** | (2006.01) |
| ***H03K 19/0185*** | (2006.01) |
| ***H04L 7/00*** | (2006.01) |
| ***H04L 25/02*** | (2006.01) |

(52) U.S. Cl.
CPC . *H03K 19/1737* (2013.01); *H03K 19/018521* (2013.01); *H04L 7/0029* (2013.01); *H04L 25/028* (2013.01)

(58) Field of Classification Search
None
See application file for complete search history.

(56) References Cited

U.S. PATENT DOCUMENTS

| | | | | |
|---|---|---|---|---|
| 6,104,234 | A * | 8/2000 | Shin | G05F 3/205 327/535 |
| 6,611,218 | B1 * | 8/2003 | Lu | H03M 9/00 327/156 |
| 7,345,602 | B2 * | 3/2008 | Saeki | H03M 9/00 341/100 |
| 8,415,980 | B2 * | 4/2013 | Fiedler | H03K 19/018521 327/108 |
| 8,487,662 | B2 * | 7/2013 | Kao | H03K 17/04163 327/403 |
| 10,014,868 | B1 * | 7/2018 | Raj | H03L 7/24 |
| 10,277,168 | B2 * | 4/2019 | Kovac | H03F 3/195 |
| 10,784,906 | B2 * | 9/2020 | Saeki | H04L 25/02 |
| 11,290,115 | B2 * | 3/2022 | Gharibdoust | H03L 7/085 |
| 12,003,233 | B1 * | 6/2024 | Tripathi | H03K 19/20 |
| 2005/0193290 | A1 * | 9/2005 | Cho | H04B 17/0085 714/710 |
| 2016/0146951 | A1 * | 5/2016 | Park | G01T 1/247 250/370.06 |

* cited by examiner

*Primary Examiner* — Thomas J. Hiltunen
(74) *Attorney, Agent, or Firm* — Fenwick & West LLP

(57) ABSTRACT

A transmitter includes a multiplexer configured to receive and process an N-bit data stream, where N is an even number. The multiplexer includes N pulse generator circuits that generate N pulse signals in N different phases of a duty cycle. The transmitter further includes a driver and an output pad connected to an output of the driver, serving as an interface between the transmitter and a transmission medium. The driver includes a first set of N transistors and a second set of N/2 transistors, configured to receive the N pulse signals as inputs to output a single bit data stream. An output of the driver is electrically coupled with the output pad.

19 Claims, 11 Drawing Sheets

| | **56Gb/s PAM4** | **112Gb/s PAM4** | **224Gb/s PAM4** |
|---|---|---|---|
| Full rate | 28GHz | 56GHz | 112GHz |
| Half rate | **14GHz** | **28GHz** | 56GHz |
| Quarter rate | 7GHz | **14GHz** | **28GHz** |
| 1/8 rate | 3.5GHz | 7GHz | **14GHz** |

FIG. 1

| | CK8[0] | CK8[1] | CK8[2] | CK8[3] | CK8[4] | CK8[5] | CK8[6] | CK8[7] |
|---|---|---|---|---|---|---|---|---|
| 8:1 MUX | 0 | 45 | 90 | 135 | 180 | 225 | 270 | 315 |
| 6:1 MUX | 0 | 60 | 120 | 180 | 180 | 240 | 300 | 0 |
| P[0] | S | | | R | | | | |
| P[1] | | S | | | R | | | |
| P[2] | | | S | | | R | | |
| P[3] | | | | S | | | R | |
| P[4] | | | | | S | | | R |
| P[5] | R | | | | | S | | |
| P[6] | | R | | | | | S | |
| P[7] | | | R | | | | | S |

FIG. 6

700
OUT
750
VB
702
704
706
708
710
712
714
716
720
722
724
726
732
734
736
738
740
742
744
746
P[0]
P[4]
P[1]
P[5]
P[3]
P[7]
P[2]
P[6]
D8RT[0]
CK8[0]
CK8[5]
D8RT[4]
CK8[4]
CK8[1]
D8RT[1]
CK8[1]
CK8[6]
D8RT[5]
CK8[5]
CK8[2]
D8RT[3]
CK8[3]
CK8[0]
D8RT[7]
CK8[7]
CK8[4]
D8RT[2]
CK8[2]
CK8[7]
D8RT[6]
CK8[6]
CK8[3]

HIGH-SPEED OCTAL-RATE WIRELINE TRANSMITTERS

CROSS REFERENCE TO RELATED APPLICATIONS

This application claims the priority of U.S. Provisional Patent Application 63/519,647, filed Aug. 15, 2023, which is incorporated herein by reference in its entirety.

TECHNICAL FIELD

The present disclosure relates to wireline transmitters, specifically to high-speed octal-rate wireline transmitters.

BACKGROUND

A wireline transmitter is a device or component used in communication systems to transmit data or signals over a physical wireline medium, such as copper or fiber optic cables. It is responsible for converting electrical signals or data into a form suitable for transmission over the wireline medium.

Wireline transmitters may have different data serialization rates, such as full rate, half rate, quarter rate, and octal rate relative to a clock rate. A full-rate transmitter utilizes only one clock phase, a half-rate transmitter utilizes two clock phases, and a quarter-rate transmitter utilizes four clock phases. A data serialization rate for a full-rate transmitter is the same as the clock rate, a data serialization rate for a half-rate transmitter is twice the clock rate, a data serialization rate for a quarter-rate transmitter is four times the clock rate. As such, a greater number of phases relaxes the clocking speed requirement and reduces power consumption at the expense of a higher number of clock phases and increased multiplexer output capacitance.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1 illustrates a table showing examples of clock rates required to achieve data serialization rates of different wireline transmitters.

FIG. 6 illustrates how $CK_{SET}$ and $CK_{CLR}$ of each pulse generator must be connected to clock bus CK8[7:0].

DETAILED DESCRIPTION

Figure 2:
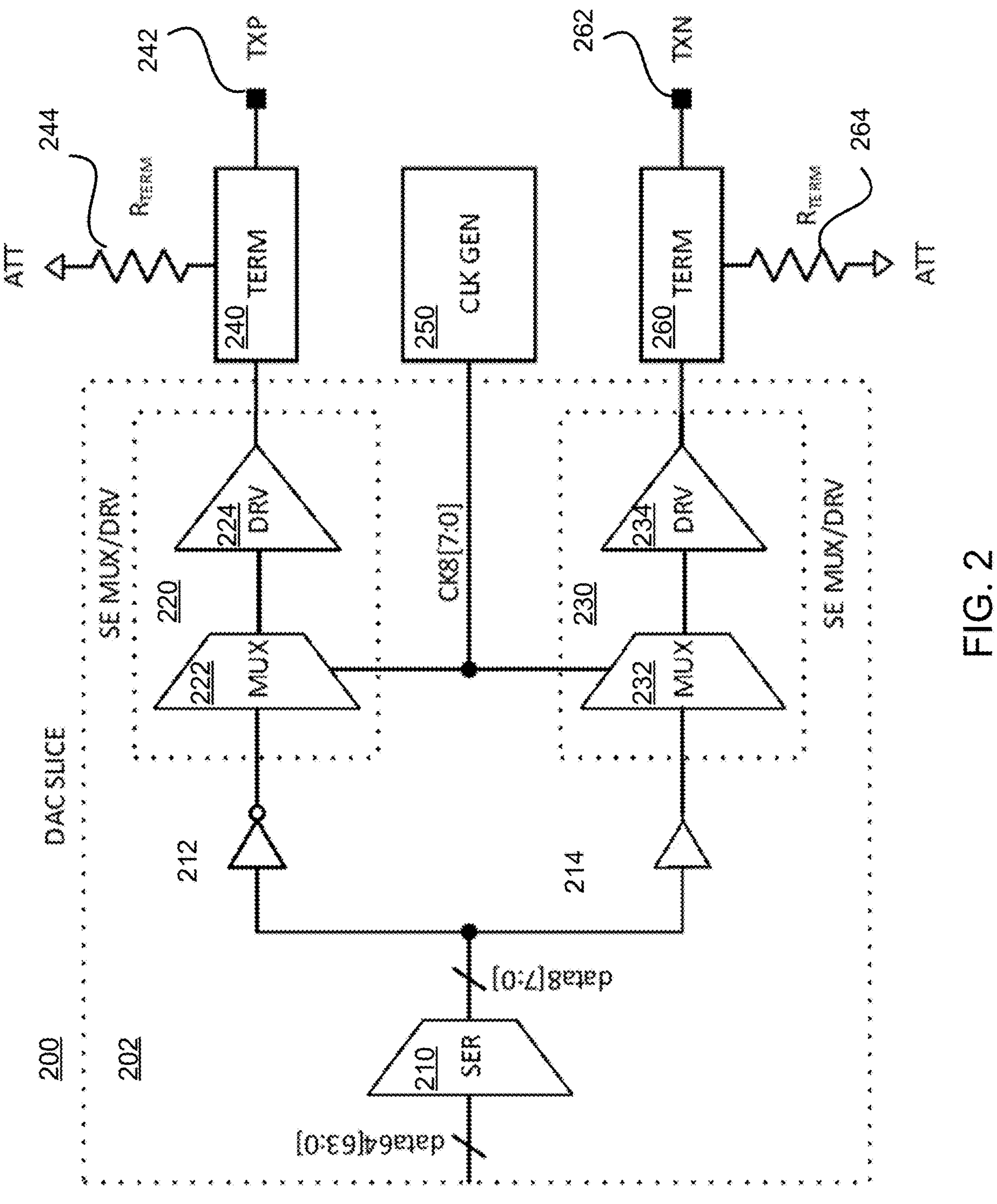
FIG. 2 illustrates an example architecture of an octal rate wireline transmitter in accordance with some embodiments.

In general, wireline transmitters operating at 28 Gbaud/s use a half-rate clock (14 GHz), where the serial output is delivered on the positive and negative clock edges. Newer wireline standards, such as 112 Gb/s pulse amplitude modulation (PAM) 4, may require a 56 Gbaud/s transmitter. Such wireline transmitters may continue to rely on the standard half-rate transmitter topology, requiring the doubling of the clock frequency to 28 GHz. Alternatively, the transmitter architecture can be modified to a quarter-rate clock which allows the clock frequency to remain at 14 GHz.

Both 14 GHz quarter-rate and 28 GHz half-rate transmitter topologies have been used successfully in 112 Gb/s PAM-4 transmitters. The two approaches have their own benefits. Limiting the clocking system to 14 GHz permits system architects to widely use standard digital CMOS circuits for clock generation, distribution and conditioning, at the cost of increased complexity due to the doubling of the number of clock phases. A half-rate, 28 GHz clock, on the other hand, limits the complexity but requires analog circuit techniques, such as inductive peaking, to manage the higher frequencies.

The introduction of 112 Gbaud/s transmitter required by 224 Gb/s PAM-4 standards once more opens the question of optimum clock rate. A half-rate clock system with a 56 GHz clock is considered impractical. Early transmitter implementations therefore rely on quarter-rate clocks operating at 28 GHz, a somewhat natural choice since quarter-rate clocks have been successfully introduced in 112 Gb/s PAM-4 designs.

However, a 28 GHz quarter rate clock for 224 Gb/s transmitter may not be the optimum choice because it combines high clock frequency without leveraging the simplicity of a half-rate system. For this reason, a ⅛th based transmitter described herein is introduced, allowing the usage of a 14 GHz clock. The transmitter architecture described herein combines 8 clock phases while maintaining sufficient analog bandwidth. In addition, the transmitter can operate with 6 clock phases, thereby reducing the transmitter baud rate by a factor of ⅔. This allows the transmitter to extend the baud rate range to a full octave with less than an octave in clock frequency range.

The transmitter operates successfully at 212 Gb/s. Measured eye diagrams at 112 Gb/s show a superior eye in terms of horizontal and vertical eye opening, compared to other designs operating at the same speed. In some embodiments, the transmitter described herein may be exclusively built from standard CMOS circuits, eliminating the need for large inductors. In some embodiments, the only inductor used in the entire transmitter is at the output termination, required to match the output impedance to the channel's characteristic impedance. While this first implementation based on a ⅛th rate clock is relatively power efficient, an upcoming design in 3 nm CMOS further lowers the power consumption to approximately 1 picojoule per bit (pJ/bit). Accordingly, the transmitter architecture described herein combines high speed operation required by upcoming wireline standards, excellent output signal quality and power efficiency.

Aspects of the present disclosure relate to high-speed high-rate (high number of phases) wireline transmitters, such as octal-rate (eight phases) transmitters. A high-rate transmitter often requires a more complex driver, which often results in high capacitance and worsened performance. Existing drivers utilizing tail-less design, often include as many transistors as the current sources as the number of phases of the transmitter. For example, a driver in an N-phase transmitter would include N transistors connected to the output pad. When N is high (e.g., N=6 or N=8), N transistors in the driver may result in an excessive capacitance, negatively impacting the performance of the transmitter.

The embodiments described herein provide a solution to this problem. In some embodiments, a transmitter includes a multiplexer (also referred to as a first multiplexer) configured to receive and process an N-bit data stream (also referred to as a first N-bit data stream), where N is an even number. The multiplexer includes a set of N pulse generator circuits configured to receive the N-bit data stream to output N pulse signals in different phases of a duty cycle. The transmitter further includes a driver (also referred to as a first driver) configured to receive the N pulse signals as inputs to output a single-bit data stream (also referred to as a first single-bit data stream). The driver includes a first set of N transistors and a second set of N/2 transistors, reducing a total number of transistors by N/2.

In some embodiments, a gate of each transistor in the first set is configured to receive one of the N pulse signals. A source of each transistor in the second set is electrically coupled with drains of a corresponding pair of transistors in the first set. Drains of transistors in the second set, working as current sources, are electrically coupled with each other and an output pad (also referred to as a first output pad), which serves as an interface between the transmitter and a transmission medium.

In some embodiments, the multiplexer further includes a second multiplexer identical to the first multiplexer, a second driver identical to the first driver, and a second output pad identical to the first output pad. The second multiplexer is configured to receive and process a second N-bit data stream that is in opposite phase of the first N-bit data stream, and the second driver is configured to output a second signal-bit data stream that is in opposite phase of the first single-bit data stream to generate differential eyes.

The disclosed configuration enables transmitters to perform much better than transmitters with traditional driver architectures. When operating at a same serialization rate, the embodiments enable performance that may be on par with lower-phase transmitters. Consequently, the transmitters described herein are able to operate at a lower clock speed to achieve a same serialization rate compared to lower-phase transmitters. Alternatively, when a same clock speed is employed, the transmitters described herein can achieve a much higher serialization rate compared to lower-phase transmitters. Additional details about the embodiments will be further described below.

Referring to FIG. 1, it is a table showing examples of clock rates required to achieve data serialization rates of different wireline transmitters. For example, the first row shows the data serialization rates 56 gigabytes (Gb) per second (s) (Gb/s), 112 Gb/s, and 224 Gb/s for PAM4 modulation scheme. PAM4 (pulse amplitude modulation 4-level) is a modulation scheme used in digital communications to transmit data over a signaling channel. It is an extension of traditional PAM2, which uses 2 levels. PAM4 employs four discrete levels of amplitude to represent multiple bits of data per symbol. In PAM4, each symbol represents two bits of data, allowing for a doubling of the data rate compared to PAM2. Instead of using just two voltage levels to represent binary 0 and 1, PAM4 uses four distinct voltage levels. These levels are typically assigned specific amplitude levels, such as −3V, −1V, 1V, and 3V, which can be positive or negative depending on the signaling convention. Note, the principles described herein are also applicable to PAM2 modulation scheme.

As illustrated in FIG. 1, the full rate row shows the clock frequencies for a full rate (one phase) transmitter required to achieve the data serialization rates, which is half of the serialization rates. The half rate row shows the clock frequency for a half rate (two phases) transmitter required to achieve the serialization rates, which is quarter of the serialization rates. The quarter rate row shows the clock frequency for a quarter rate (four phases) transmitter required to achieve the serialization rates, which is ⅛ of the serialization rates. The ⅛ (octal) rate row shows the clock frequency for an octal rate (eight phases) transmitter required to achieve the serialization rates, which is 1/16 of the serialization rates. Notably, the higher the number of phases of the transmitter, the lower the clock rate required to achieve the same serialization rate. Thus, using a higher-phase transmitter relaxes the requirement of clock speed.

Generally, a clock generator has a maximum clock speed at which a clock signal can be reliably generated and used in a digital system. The clock rate determines the rate at which operations and data transfer occur within a system, impacting its overall performance and functionality. The clock rate is typically limited by various factors, including the capabilities of the system components, the electrical characteristics of the circuitry, and the technology used in the system.

For example, the clock rate can be limited by the capabilities of the system components, such as integrated circuits. Each component has its own maximum operating frequency, beyond which reliable operation cannot be guaranteed. Further, digital systems rely on precise timing relationships between different circuit elements. As the clock rate increases, there is less time available for each individual operation, and timing constraints become more challenging to meet. Propagation delays, setup and hold times, and other timing requirements can also impose limitations on the maximum achievable clock rate. Additionally, increasing the clock rate can introduce signal integrity issues, such as signal distortions, noise, crosstalk, and reflections. These factors can lead to timing errors, data corruption, and reduced system reliability. Further, higher clock rates typically result in increased power consumption and heat dissipation. Power supply limitations and thermal constraints may also restrict the maximum clock rate to prevent excessive power consumption, overheating, and potential damage to the system. Also, as the size of transistors decreases with technology scaling, various physical and electrical limitations, such as leakage currents and interconnect capacitance, can arise, imposing practical limits on clock rate scaling.

Due to the complications of increasing clock rates, a clock generator with a higher maximum clock speed is often more costly than a clock generator with a lower maximum clock speed. Since a higher-phase transmitter relaxes the requirement of clock speed, a less expensive clock generator may be implemented for a higher-phase transmitter to achieve a same serialization rate. Further, in some embodiments, it is desirable to limit clock frequency to 14 GHz due to various reasons. When a high serialization rate and a low clock frequency are both desired, a higher phase transmitter would be used. For example, to achieve 112 Gb/s serialization rate, a half-rate transmitter requires a 28 GHz circuit, while a quarter-rate transmitter only requires a 14 GHz circuit. In such a case, a quarter-rate transmitter may be more desirable than a half-rate transmitter to achieve 112 Gb/s serialization rate. Similarly, to achieve 224 Gb/s serialization rate, a quarter rate transmitter requires a 28 GHz clock speed, while an octal rate transmitter only requires a 14 GHz clock speed. In such a case, an octal rate transmitter may be more desirable than a quarter-rate transmitter to achieve 224 Gb/s serialization rate.

Embodiments described herein relate to a high-phase (e.g., 6 phase, 8 phase) wireline transmitter that enables high-speed serialization. A simplified block diagram of an example wireline transmitter is shown in FIG. 2. The topology may share components with transmitters based on half-rate or quarter-rate clocks. This includes a data serializer (SER) 210 which reduces the width of the parallel data bus to a narrower data bus with accordingly increased clock frequency. While the data serializer 210 output bus must be 8-bit wide as required by the following multiplexer 222, 232/driver circuit 224, 234 (SE MUX/DRV), different serializer input data bus widths can be used to accommodate the data format of the application specific integrated circuit (ASIC), which delivers the data to the wireline transmitter. As shown in FIG. 2, a 64-bit wide bus is chosen here, but buses of different widths can be utilized without restriction. Other commonalities with half and quarter-rate transmitters include a reactive termination network (TERM) 240 and a termination resistor 244 ($R_{TERM}$). The latter converts the current mode driver signal into a voltage and matches the transmitter impedance to the characteristic impedance Z0 of the interconnecting channel attached to the transmitter. The reactive component of the termination network 240 helps extend the transmitter signal bandwidth which is otherwise limited by resistor 244 ($R_{TERM}$) and the driver output capacitance $C_{OUT}$. In addition, the reactive termination network 240 is designed to partially cancel the driver and ESD protection capacitances thereby improving the high-frequency return loss.

In particular, FIG. 2 illustrates an example architecture of an 8-phase (also referred to as an octal rate) wireline transmitter 200 in accordance with some embodiments. Note, even though the drawings and descriptions mostly relate to an octal-rate (8-phase) transmitter, the principles described herein are applicable to other rates/phase transmitters.

The octal rate wireline transmitter 200 includes a digital-to-analog (DAC) slice 202, a clock generator, 250, a first reactive termination network 240, a second reactive termination network 260, a first output pad TXP 242, and a second output pad TXN 262. The DAC slice 202 includes a serializer 210, an inverter 212, a buffer 214, a first transmitter circuit 220, and a second transmitter circuit 230. The serializer 210 is configured to convert parallel data stream (e.g., 64-bit data, denoted as [63:0]) into a data stream with fewer bits (e.g., 8-bit data, denoted as [7:0]). The 8-bit data is then input to the inverter 212 and the buffer 214. The output of the inverter 212 and the output of the buffer 214 are the same data signal in opposite phases. The output of the inverter 212 is input into the first transmitter circuit 220, and the output of the buffer 214 is input into the second transmitter circuit 230.

In some embodiments, the first transmitter circuit 220 and the second transmitter circuit 230 are identical circuits. Each of the first transmitter circuit 220 or the second transmitter circuit 230 includes a multiplexer 222, 232 and a driver 224, 234. The multiplexer 222, 232 is configured to further serialize the 8-bit data stream into one-bit data stream. The clock generator 250 generates 8 clock signals (denoted as CK8 [7:0]) having 8 different phases evenly spaced apart in a duty cycle. The output of the multiplexer 222 or 232 is input to the driver 224 or 234. Each driver 224, 234 is a current mode driver configured to generate a current, which is sent to a corresponding termination network 240, 260. The current pass through the resistor 244, 264, converting the current signals to voltage signals, which are output at the pads TXP 242 and TXN 262. The 8-phase clock signals serve timing references for facilitating the selecting of one of the 8-bits data stream.

Different from a half-rate or quarter-rate based transmitter, a clock generator (CLK GEN) delivers eight clock phases CK8[7:0]. With the baud rate of the transmitter given by the product of the clock generator frequency times the number of clock phases, lower clock frequencies can be utilized for a desired baud rate. The introduction of an 8-phase clock generator is especially beneficial to ultra high speed transmitters, where half-rate or quarter-rate based topologies require impractically high clock frequencies.

Figure 3:
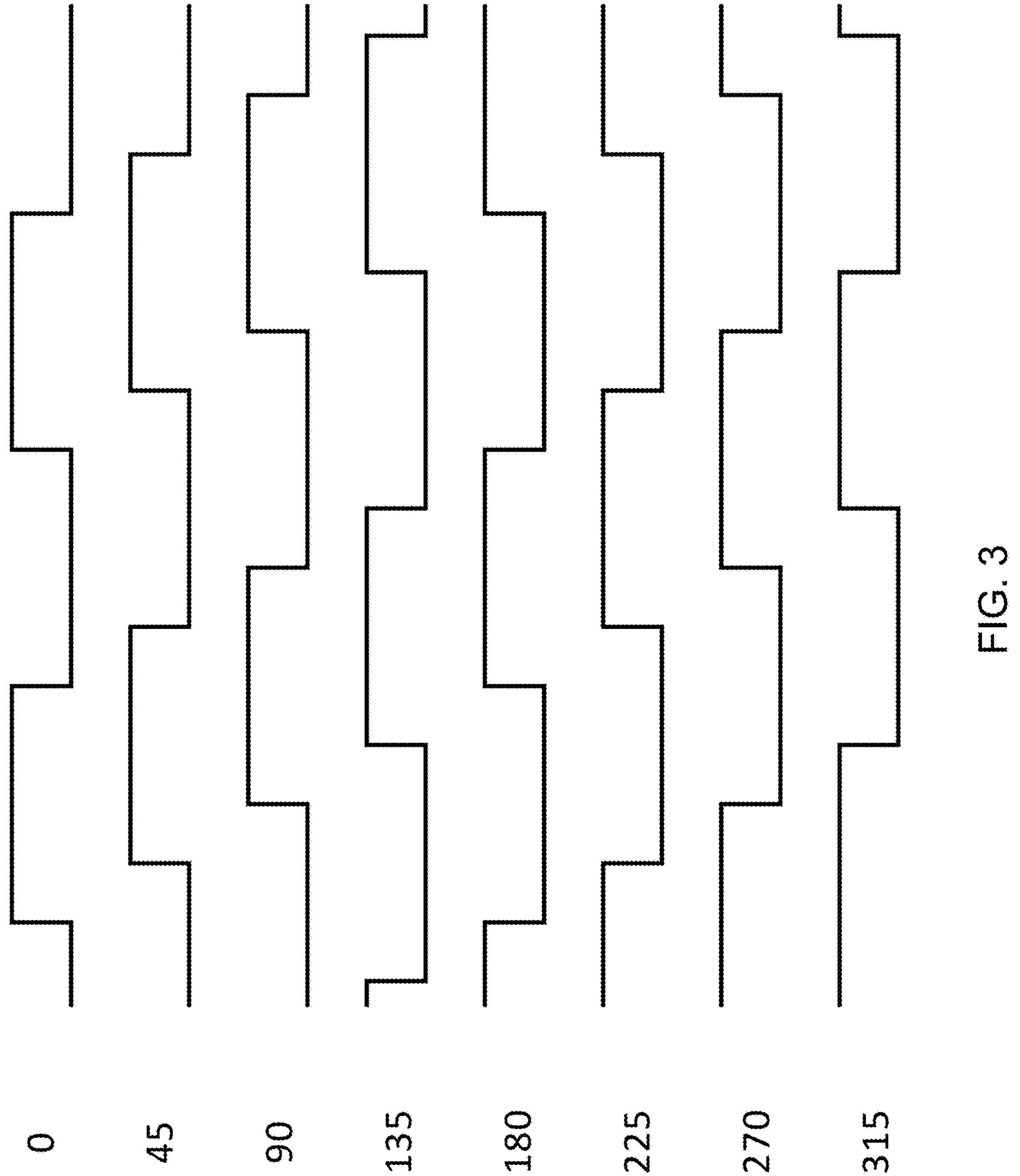
FIG. 3 illustrates an example of 8-phase clock signals that may be used by the multiplexers in accordance with some embodiments.

FIG. 3 illustrates an example of 8-phase clock signals that may be used by the multiplexers 222, 232 in accordance with some embodiments. As illustrated, a whole duty cycle is 360 degrees, which is divided evenly into 8 phases. As illustrated, a first signal is at 0 degrees, a second signal is at 45 degrees, a third signal is at 90 degrees, a fourth signal is at 135 degrees, a fifth signal is at 180 degrees, a sixth signal is at 225 degrees, a seventh signal is at 270 degrees, and the eighth signal is at 315 degrees.

Figure 4:
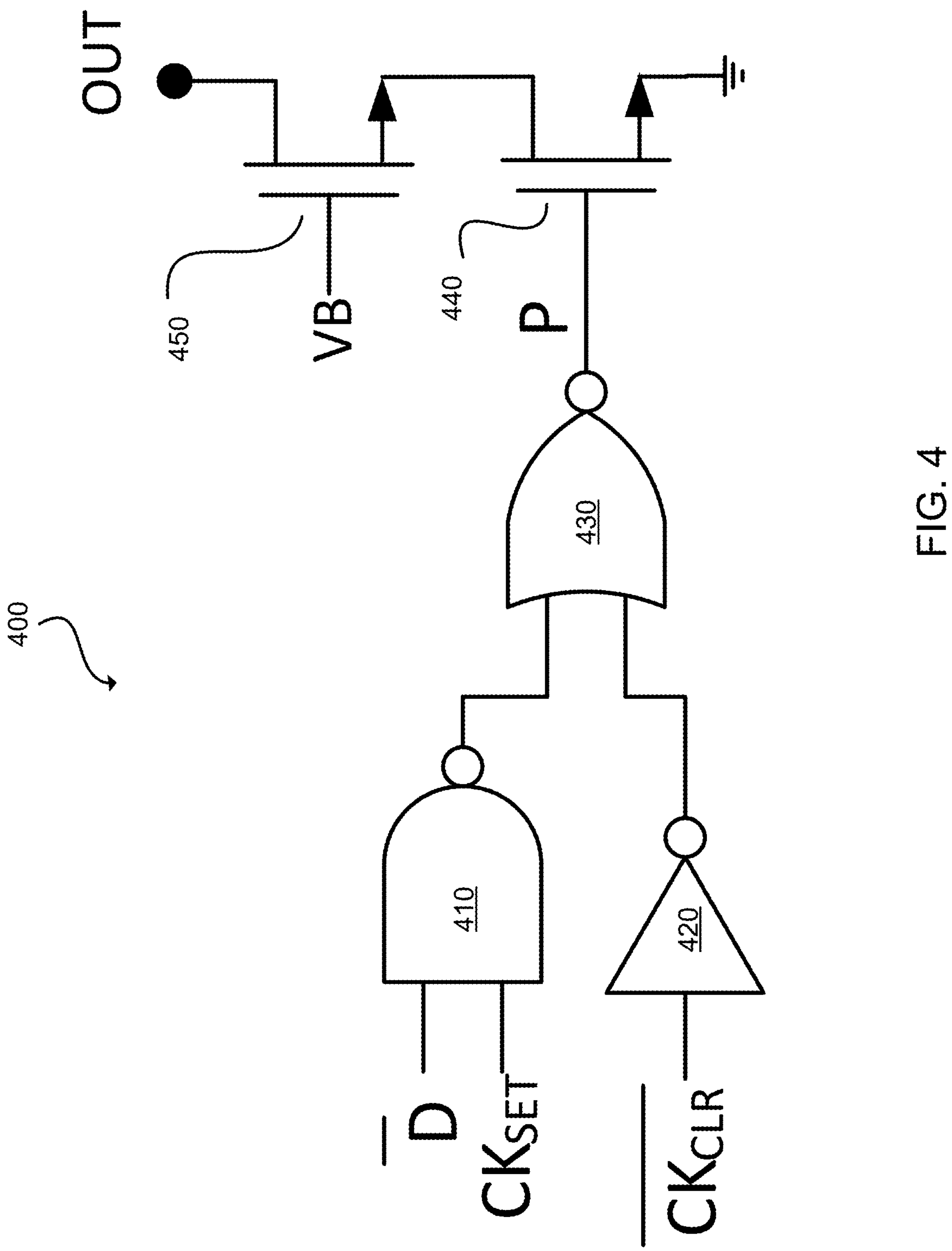
FIG. 4 illustrates an example pulse generator circuit.

In some embodiments, each of the multiplexer 222 or multiplexer 232 includes eight identical pulse generator circuits. Very short data pulses are generated from much lower frequency clock phases by the help of a NAND, a NOR and an inverter, as shown in FIG. 4. Here, a short pulse data P is generated between the positive edge of $CK_{SET}$ and the negative edge of $CK_{CLR}$, conditional on the data input D.

FIG. 4 illustrates an example pulse generator circuit 400 in detail. The pulse generator circuit 400 includes a NAND gate 410, an inverter 420, and a NOR gate 430. The NAND gate 410 receives a data signal D and a clock signal $CK_{SET}$ (also referred to as a first clock signal) as inputs. The inverter 420 receives a second clock signal $CK_{CLR}$ as input. The outputs of the NAND gate 410 and the inverter 420 are input to the NOR gate 430. The output of the NOR gate 430 is the output of the pulse generator circuit 400 (denoted as P). The signal P will then be converted into an output current signal (denoted as $I_{out}$) by the help of two NMOS transistors 440 and 450, of which one acts as a switch 440 connected to P and the second working as a current source 450. The current strength is set by the gate bias voltage VB, generated by a dedicated bias circuit.

Figure 5:
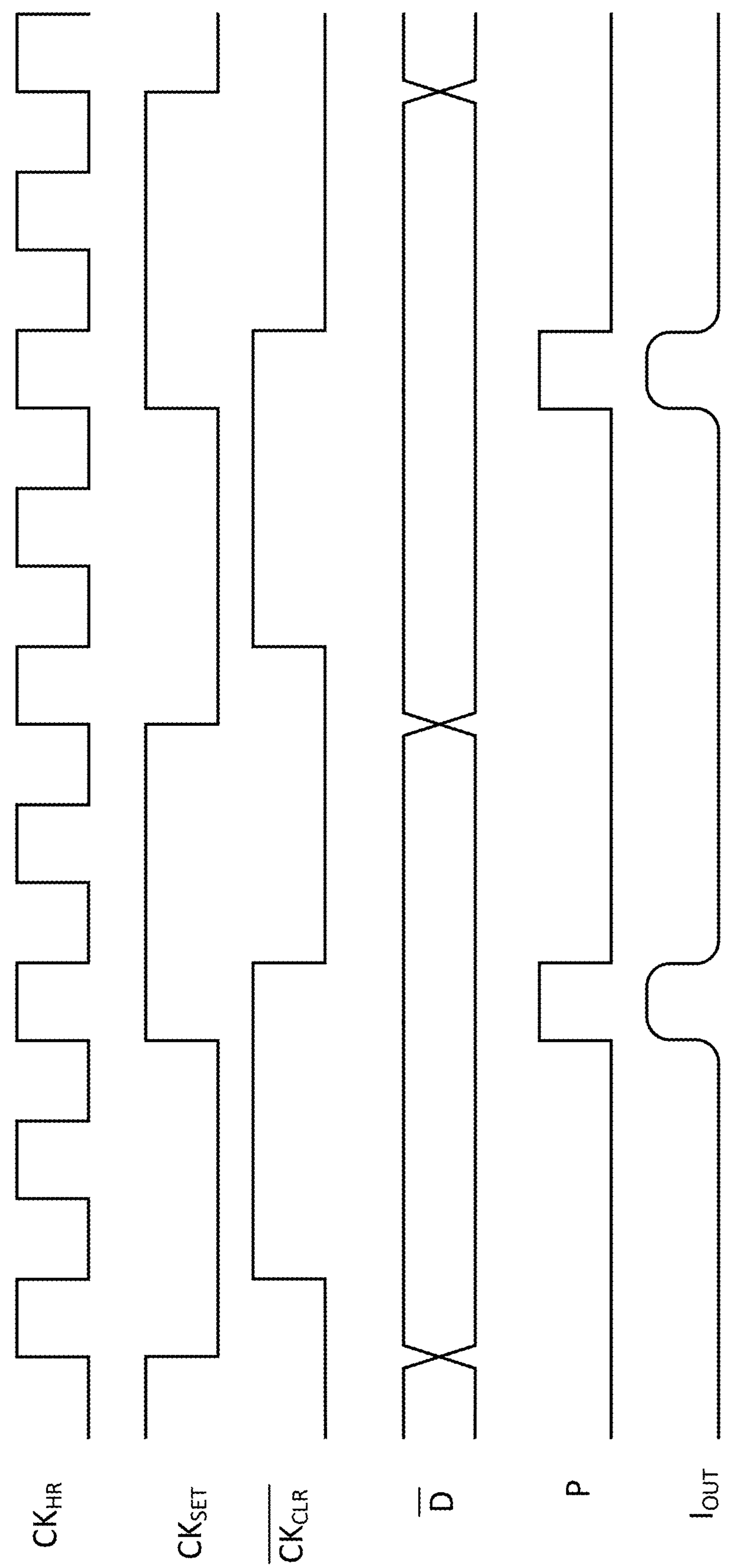
FIG. 5 illustrates the principal timing diagram of the example pulse generation circuit.

A principal timing diagram of the circuit is shown in FIG. 5 illustrating an example of a heart rate clock signal (denoted as $CK_{HR}$), a first clock signal $CK_{SET}$ (corresponding to the first clock signal $CK_{SET}$ in FIG. 4), a second clock signal $\overline{C}$ $\overline{K}_{CLR}$ (corresponding to the second clock signal $\overline{CK}_{CLR}$ in FIG. 4), the data signal $\overline{D}$ (corresponding to the data signal $\overline{D}$ in FIG. 4), the signal P (corresponding to the output signal P in FIG. 4), and an output current signal $I_{out}$. As illustrated, 8 heart rate clock cycles is a duty cycle for the pulse generator circuit 400. The output signal P is a ⅛ pulse in a duty cycle. The rising edge of P is generated by NAND gate

410 and NOR gate 430. The falling edge of P is generated by inverter 410 and NOR gate 430.

As the output of the pulse generator is a current, multiple pulse generator units with shorted outputs can be combined to form a data multiplexer. FIG. 6 shows how $CK_{SET}$ and $CK_{CLR}$ of each pulse generator must be connected to clock bus CK8[7:0]. Here, the 8 pulse generators can form an 8:1 data multiplexer or a 6:1 data multiplexer. In the former case, CK8[7:0] contains 8 clock phases each 45 degrees apart, as shown in FIG. 3. Given this configuration, data bus D[7:0] is multiplexed to the output with D[0] sent first and D[7] sent last.

Alternatively, a 6:1 multiplexer is formed by 6 clock phases, each 60 degrees apart, Note that, in some embodiments, all 8 clocks of the CK8[7:0] clock bus are driven according to FIG. 3. This requires that CK8[3]=CK8[4] and CK8[7]=CK8[0]. In this mode, the 6 to 1 multiplexer delivers at the output data sequence D[0], D[1], D[2], D[4], D[5], D[6]. In some embodiments, unused data bus instances D[3] and D[7] are connected low to avoid any interference.

The introduction of 8 clock phases and 8 pulse generators enables ultra high speed transmitters at a relatively low clock frequency. However, a direct implementation with 8 pulse generator units directly connected to the output can result in an unacceptable bandwidth limitation due to excessively large output capacitance.

For example, in an existing transmitter circuit, each pulse generator circuit often is coupled with a switch and its corresponding current source transistor coupled to the output node. Such a transmitter circuit may work well for half-rate or quarter-rate transmitters, but not for octal-rate or higher-rate transmitters due to a high capacitance at the output caused by a high number of current source transistors. For example, When there are eight pulse generator circuits in a multiplexer (each of which has a current source transistor connected at the output), a driver circuit would have 8 current source transistors, resulting in a high capacitance at the output node.

Figure 7:
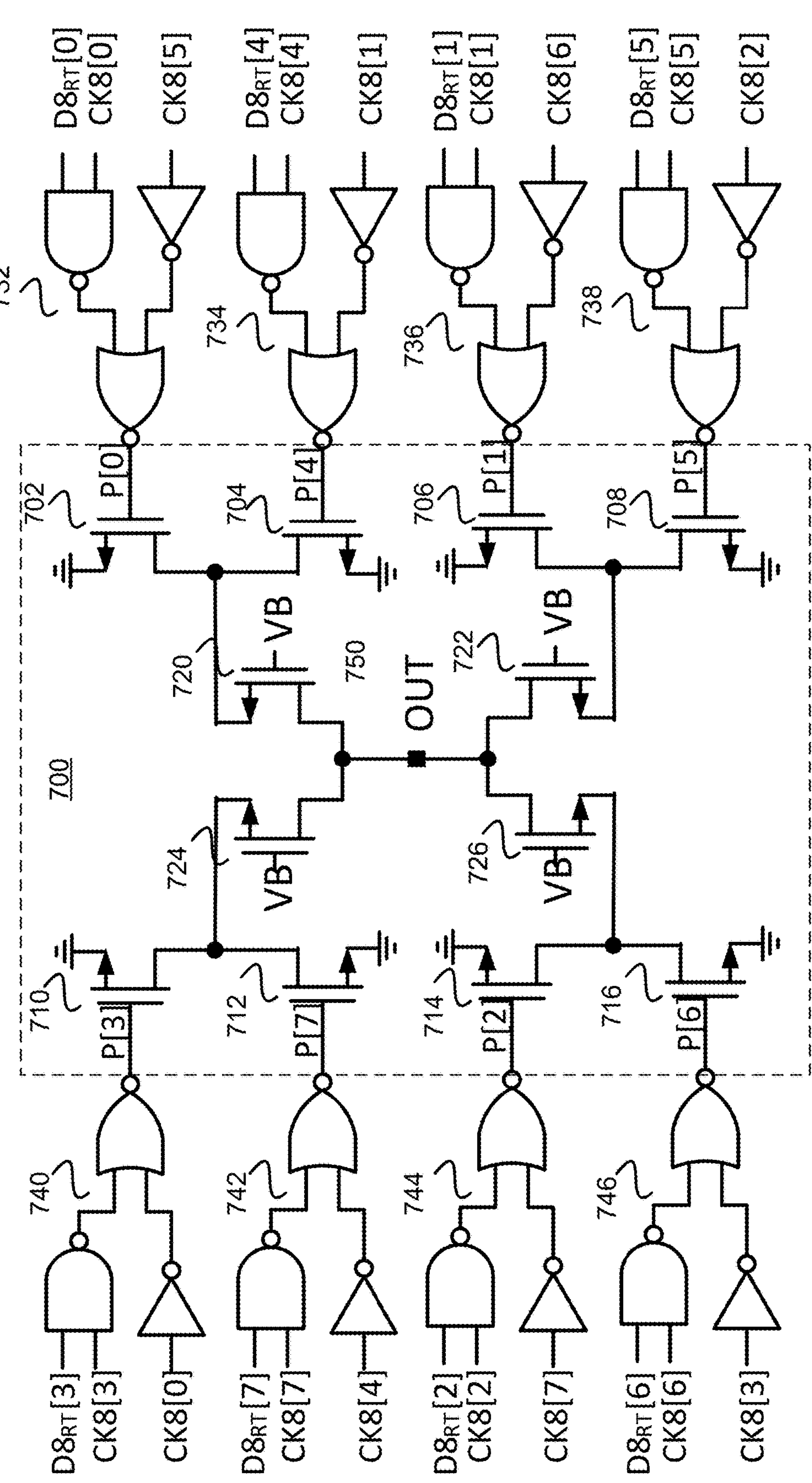
FIG. 7 illustrates an example of a driving circuit for an octal transmitter with 12 transistors in accordance with some embodiments.

To mitigate this problem, the multiplexer/driver topology has been modified according to FIG. 7. Here, an NMOS switch pair 710 and 712 shares the same current source 724. This moderately increases the capacitance at the source node of the current source NMOS 724, but limits the number of current source transistors connected to the output OUT pad 750 to 4 (720, 722, 724 and 726). In particular, the embodiments described herein include a driving circuit that only has 12 transistors, four of which are shared by the eight pulse generator circuits. This structure, in combination with an optimized layout, delivers the required bandwidth when combined with bandwidth extension provided by the reactive termination network.

FIG. 7 illustrates an example of a driving circuit 700 with only 12 transistors in accordance with some embodiments. The driving circuit 700 includes eight transistors 702, 704, 706, 708, 710, 712, 714, 716, each of which is coupled with a corresponding pulse generator circuit 732, 734, 736, 738, 740, 742, 744, 746, each of which corresponds to the pulse generator circuit 400 of FIG. 4. As illustrated, a gate of transistor 702 is electrically connected to an output of the pulse generator circuit 732; a gate of transistor 704 is electrically connected to an output of the pulse generator circuit 734; a gate of transistor 706 is electrically connected to an output of the pulse generator circuit 736; a gate of transistor 708 is electrically connected to an output of the pulse generator circuit 738; a gate of transistor 710 is electrically connected to an output of the pulse generator circuit 740; a gate of transistor 712 is electrically connected to an output of the pulse generator circuit 742; a gate of transistor 714 is electrically connected to an output of the pulse generator circuit 744; and a gate of transistor 716 is electrically connected to an output of the pulse generator circuit 746.

The driving circuit 700 further includes four transistors 720, 722, 724, 726, each of which is coupled with a corresponding pair of transistors 702, 704, 706, 708, 710, 712, 714, 716. As illustrated, a drain of transistor 702 and a drain of transistor 704 are electrically connected to a source of transistor 720; a drain of transistor 706 and a drain of transistor 708 are electrically connected to a source of transistor 722; a drain of transistor 710 and a drain of transistor 712 are electrically connected to a source of transistor 724; and a drain of transistor 714 and a drain of transistor 716 are electrically connected to a source of transistor 726. Drains of transistors 720, 722, 724, and 726 are used as current sources to limit the output current and are electrically connected to an output pad 750.

In some embodiments, a subset of the multiplexer circuits 732-746 or a subset of driving circuit 700 may be disabled to allow the transmitter to operate as a lower rate transmitter. For example, any two of the multiplexer circuits 732-746 and their corresponding transistors in the driving circuit 700 may be disabled to allow the multiplexer to operate as a ⅙ rate (6-phase) transmitter. As another example, any four of the multiplexer circuits 732-746 and their corresponding transistors in the driving circuit 700 may be disabled to allow the multiplexer to operate as a quarter rate (4-phase) transmitter. Again, any six of the multiplexer circuits 732-746 and their corresponding transistors in the driving circuit 700 may be disabled to allow the multiplexer to operate at a half rate (2-phase) transmitter.

Alternatively, the transmitter may include a different number of multiplexer circuits and their corresponding transistors in the driving circuit. For example, the transmitter may include six multiplexer circuits and 9 transistors in the driving circuit to form a ⅙ rate (6-phase) transmitter. Generally, 1/N-rate (N-phase) transmitter requires N multiplexer circuits and a driver circuit having 1.5*N transistors, where N is an even number. A person in the art would be able to understand that embodiments described herein include various high-rate (high phase) transmitters, including (but not limited to) octal-rate transmitters.

Figure 8:
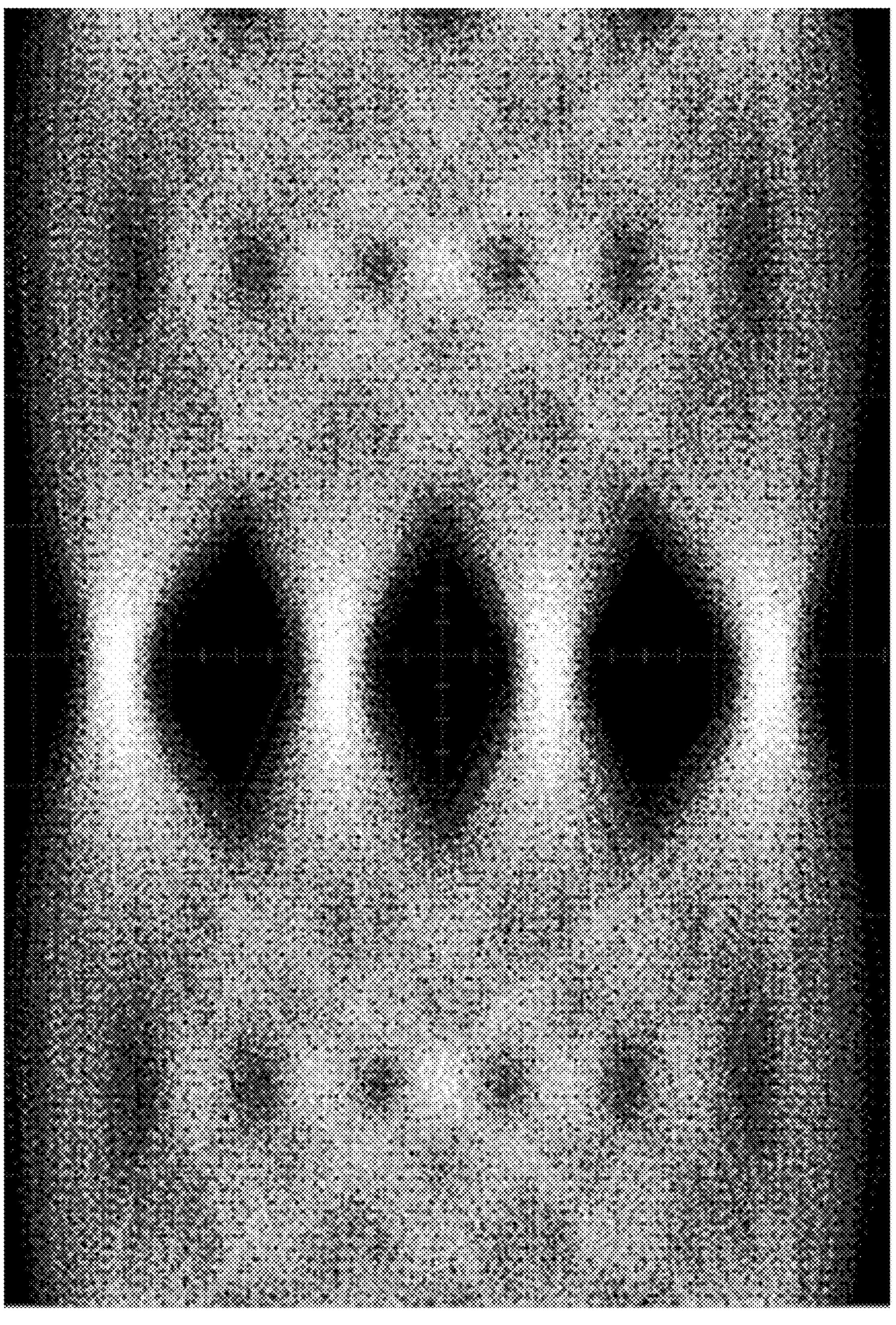
FIG. 8 is an eye diagram showing performance of an octal rate transmitter circuit described herein with a serialization rate of 212 Gb/s and pulse amplitude modulation (PAM) 4 modulation.
Figure 9:
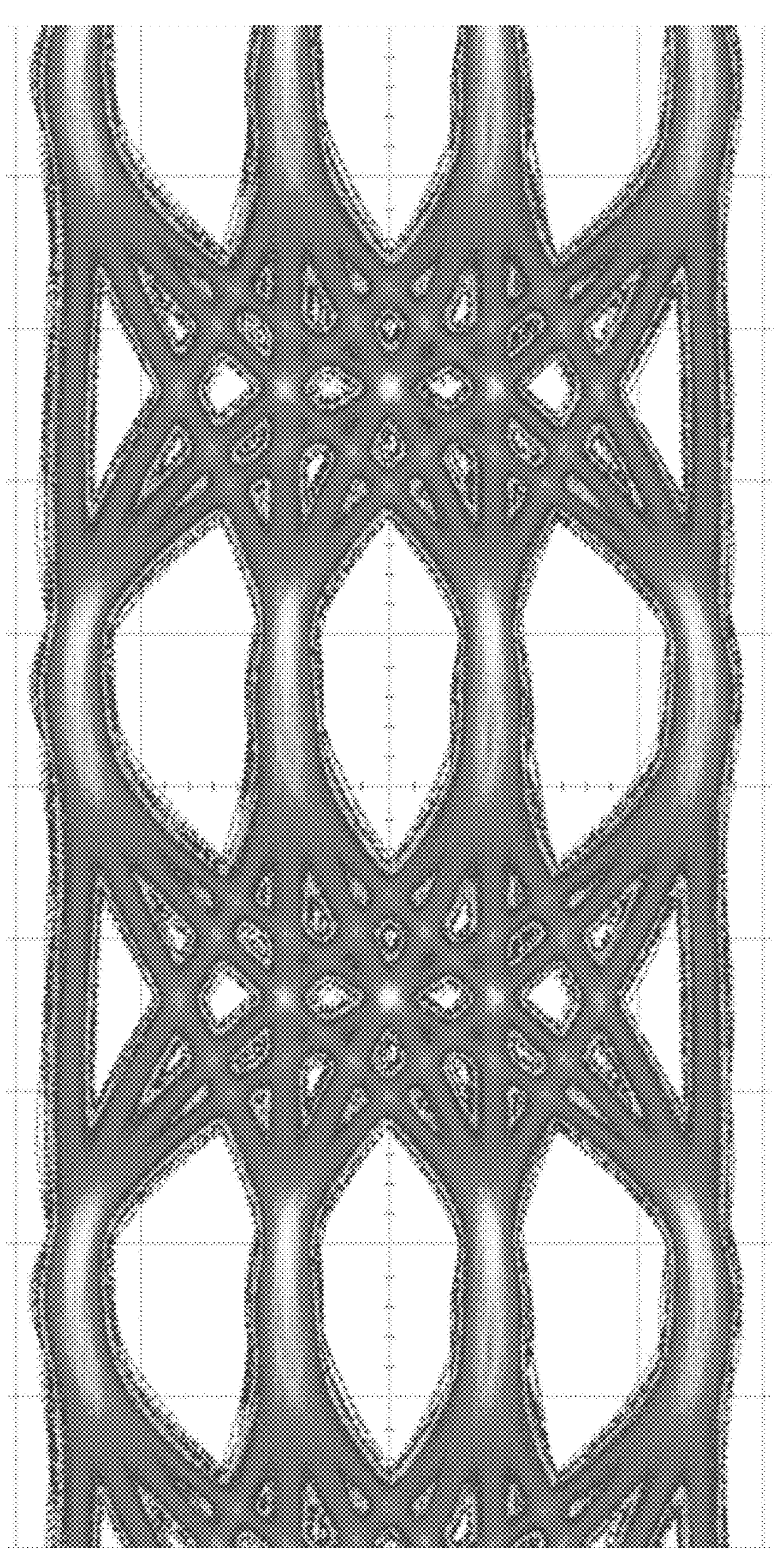
FIG. 9 is an eye diagram showing performance of an octal rate transmitter circuit described herein with a serialization rate of 112 Gb/s and PAM4 modulation.
Figure 10:
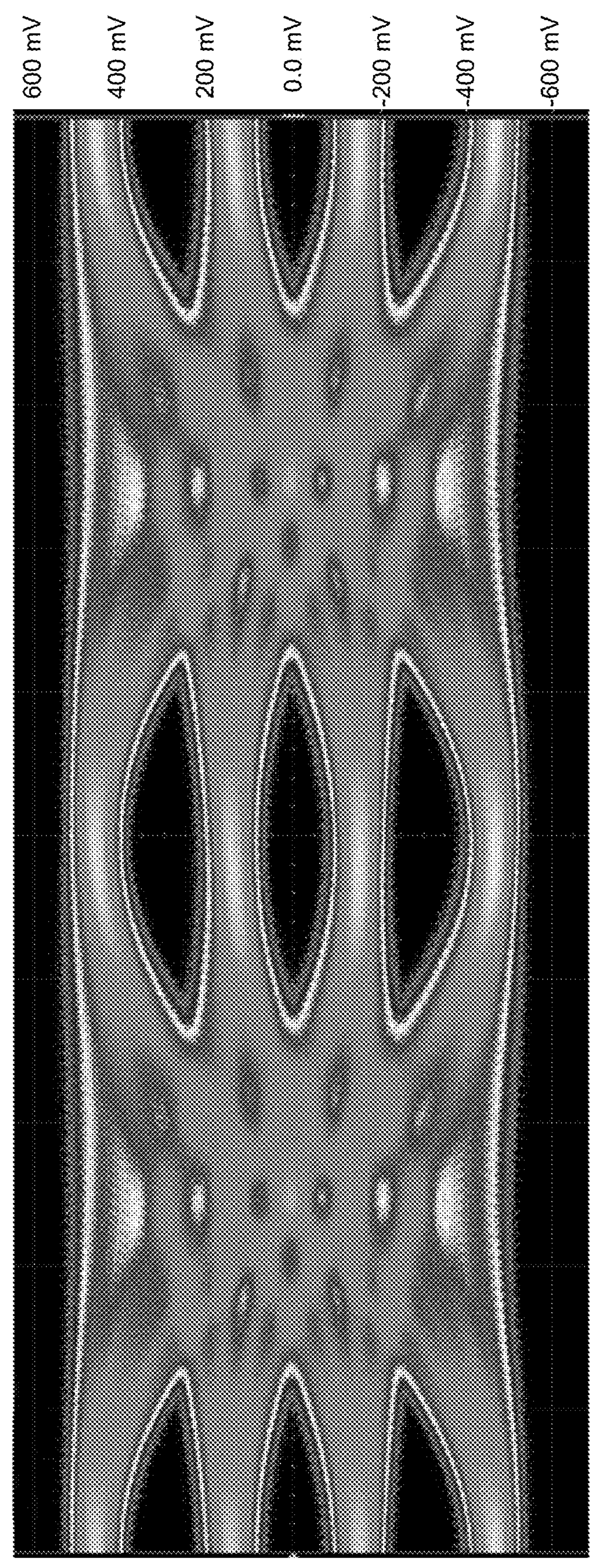
FIG. 10 is an eye diagram showing performance of an octal rate transmitter circuit described herein with a serialization rate of 120 Gb/s and PAM4 modulation.

Experiments show that an octal rate transmitter circuit with a driving circuit described herein performs much better than a transmitter circuit with a traditional driving circuit. FIG. 8 is an eye diagram showing performance of an octal rate transmitter circuit described herein operating at a serialization rate of 212 Gb/s under PAM4 modulation scheme. FIG. 9 is an eye diagram showing performance of an octal rate transmitter circuit described herein operating at a serialization rate of 112 Gb/s under PAM4 modulation scheme. FIG. 10 is an eye diagram showing performance of an octal rate transmitter circuit described herein operating at a serialization rate of 120 Gb/s under PAM4 modulation scheme.

Each eye diagram is a graphical representation of a signal's behavior over multiple-bit periods in the octal rate transmitter described herein. It provides insights into the quality and integrity of the transmitted signal. It is created by overlaying and aligning multiple instances of the received signal, with each instance representing a specific bit period. The vertical axis represents the signal amplitude, and the horizontal axis represents time. Each of the eye diagrams shown in FIGS. 8-10 displays a well-defined eye opening among four levels, representing the digital 0, 1, 2, and 3 states in PAM4 modulation scheme. The eye opening corresponds to the regions in the diagram where the received signal is most likely to be correctly interpreted, providing a clear distinction between different voltage levels. The width and height of the eye opening provide information about the signal's amplitude, noise levels, and timing characteristics.

The eye diagrams shown in FIGS. 8-10 indicate that the octal rate transmitter circuit performs at least as well as quarter-rate, half-rate, and/or full-rate transmitters, while allowing the transmitter to operate at a lower clock speed. Alternatively, the octal rate transmitter circuit described herein enables a faster serialization rate than existing quarter-rate, half-rate, and/or full-rate transmitters when a same clock speed is used. Further, because all clock generators have their maximum rates, even the fastest clock generator has its maximum rate. When the fastest clock generator is used, the octal rate transmitter circuit described herein would enable a serialization rate that is 16 times the clock rate, outperforming any quarter rate, half rate, or full rate transmitter circuits.

Figure 11:
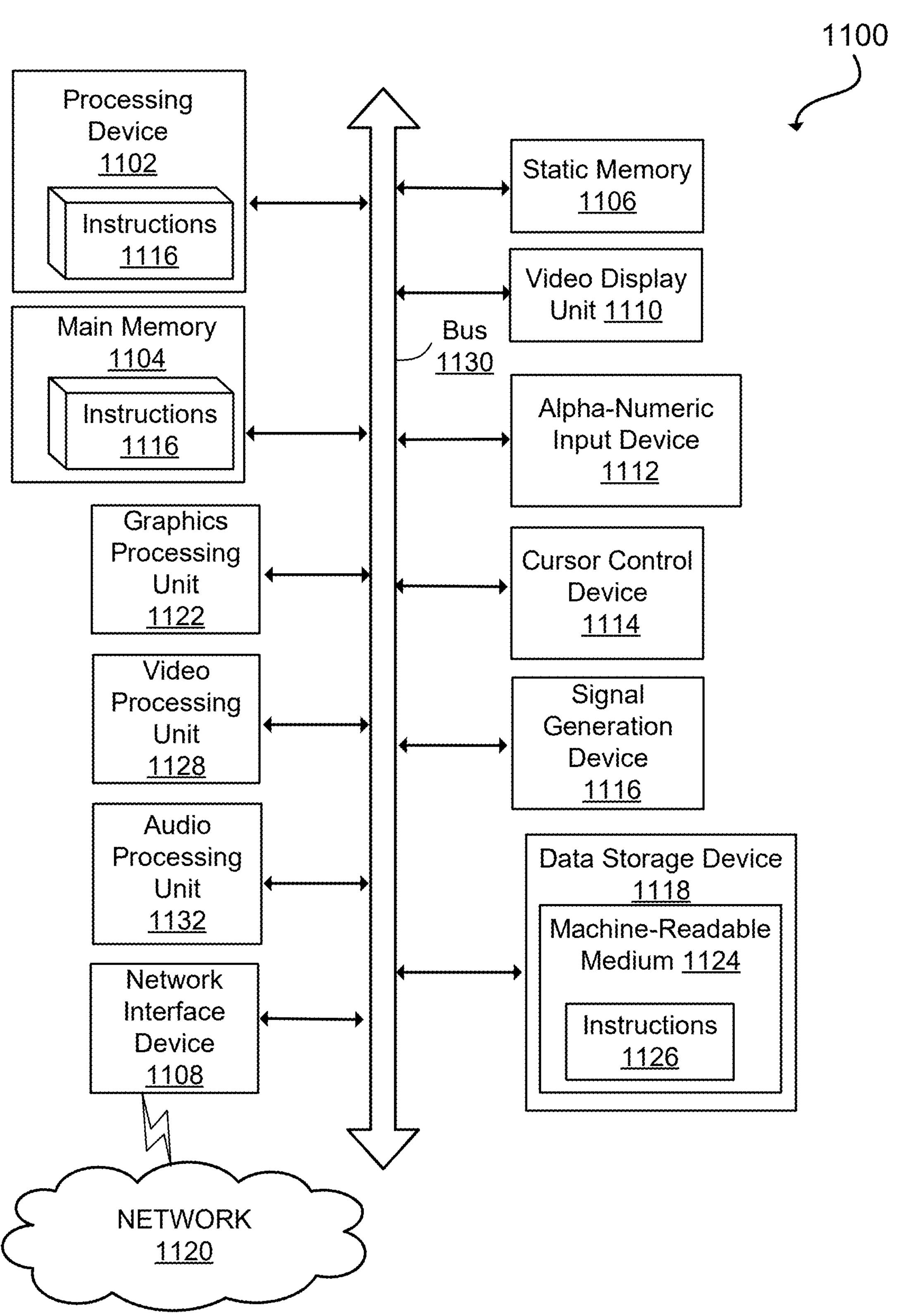
FIG. 11 depicts a diagram of an example computer system in which embodiments of the present disclosure may operate.

FIG. 11 illustrates an example machine of a computer system 1100 comprising one or more processors (e.g., processing device 1102) and a non-transitory storage medium (e.g., static memory 1106, main memory 1104), which stores a set of instructions (e.g., instructions 1126). When the set of instructions are executed by at least one of the one or more processors, the at least one processor is caused to simulate or emulate the transmitters discussed herein. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a Personal Digital Assistant (PDA), a smartphone, a web appliance, a server, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM), a static memory 1106 (e.g., flash memory, static random access memory (SRAM), etc.), and a data storage device 1118, which communicate with each other via a bus 1130.

Processing device 1102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 may also be one or more special-purpose processing devices such as an application specific integrated circuit (ASIC), a field programmable gate array (FPGA), a digital signal processor (DSP), network processor, or the like. The processing device 1102 may be configured to execute instructions 1126 for performing the operations and steps described herein.

The computer system 1100 may further include a network interface device 1108 to communicate over the network 1120. The computer system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a graphics processing unit 1122, a signal generation device 1116 (e.g., a speaker), graphics processing unit 1122, video processing unit 1128, and audio processing unit 1132.

The data storage device 1118 may include a machine-readable storage medium 1124 (also known as a non-transitory computer-readable medium) on which is stored one or more sets of instructions 1126 or software embodying any one or more of the methodologies or functions described herein. The instructions 1126 may also reside, completely or at least partially, within the main memory 1104 and/or within the processing device 1102 during execution thereof by the computer system 1100, the main memory 1104 and the processing device 1102 also constituting machine-readable storage media.

In some implementations, the instructions 1126 include instructions to implement functionality corresponding to the present disclosure. While the machine-readable storage medium 1124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

Embodiments described herein relate to a transmitter. The transmitter includes a multiplexer configured to serialize an N-bit data stream into a one-bit data stream and a driver, wherein N is an even number. The multiplexer includes a set of N pulse generator circuits configured to generate an even number of pulse signals in different phases of a duty cycle. The driver, configured as a current-mode tail-less structure, includes a first set of N transistors and a second set of N/2 transistors. The first set of N transistors act as switches, and the second set of N/2 transistors act as current sources. A gate of each transistor in the first set is electrically coupled with an output of a corresponding pulse generator circuit, and a source of each transistor in the second set is electrically coupled with drains of a corresponding pair of transistors in the first set. Drains of transistors in the second set of N/2 transistors (which act as current sources) are electrically coupled with an output pad. In some embodiments, N=8. The transmitter is an octal transmitter.

Other aspects include components, devices, systems, improvements, methods, processes, applications, computer-readable mediums, and other technologies related to, simulating, and/or emulating any of the above.

What is claimed is:

1. A transmitter, comprising:

a multiplexer configured to receive and process an N-bit data stream, wherein N is an even number, the multiplexer comprising:

a set of N pulse generator circuits configured to receive the N-bit data stream to output N pulse signals in N different phases of a duty cycle, each of the pulse generator circuits comprising a NAND gate, an inverter, and a NOR gate, wherein the NAND gate receives a data signal and a first clock signal as inputs to generate a first output, the inverter receives a second clock signal as input to generate a second output, the NOR gate receives the first output and the second output as inputs to generate a third output, and the third output is an output of the pulse generator circuit that is received by a driver;

the driver configured to receive the N pulse signals as inputs to output a single-bit data stream, the driver comprising a first set of N transistors, acting as switches and a second set of N/2 transistors acting as current sources; and an output pad electrically coupled with an output of the driver, serving as an interface between the transmitter and a transmission medium, wherein a gate of each transistor in the first set is configured to receive one of the N pulse signals, a source of each transistor in the second set is electrically coupled with drains of a corresponding pair of transistors in the first set, and drains of the transistors in the second set electrically coupled with the output pad.

2. The transmitter of claim 1, wherein the multiplexer is a first multiplexer, the driver is a first driver, the output pad is a first output pad, the N-bit data stream is a first N-bit data stream, and the single-bit data stream is a first single-bit data stream, wherein the transmitter further comprises a second multiplexer identical to the first multiplexer, a second driver identical to the first driver, and a second output pad identical to the first output pad, wherein the second multiplexer is configured to receive and process a second N-bit data stream that is in opposite phase of the first N-bit data stream, and wherein the second driver is configured to output a second single-bit data stream that is in opposite phase of the first single-bit data stream.

3. The transmitter of claim 1, wherein N is equal to 6 or 8.

4. The transmitter of claim 1, wherein the third output is a voltage signal, and the driver is a current mode driver configured to convert the voltage signal into a current signal.

5. The transmitter of claim 1, the transmitter further comprising a clock generator configured to generate N-phase clock signals, each of which is evenly spaced apart in a duty cycle, wherein the N-phase clock signals are input to the multiplexer as timing references for facilitating selecting of one of the N-bit data stream.

6. The transmitter of claim 5, wherein N is equal to 8, the N-phase clock signals comprise:

a first clock signal at 0 degree;

a second clock signal at 45 degrees;

a third clock signal at 90 degrees;

a fourth clock signal at 135 degrees;

a fifth clock signal at 180 degrees;
a sixth clock signal at 225 degrees;
a seventh clock signal at 270 degrees; and
an eighth clock signal at 315 degrees.

7. The transmitter of claim 5, the clock generator is configured to generate one of following clock rates: 7 GHz, 14 GHz, 28 GHz, 56 GHz, or 112 GHz.

8. The transmitter of claim 7, wherein the transmitter is configured to have a serialization rate that is 16 times of a clock rate generated by the clock generator.

9. The transmitter of claim 1, wherein the N-bit data stream or the single-bit data stream is modulated under pulse amplitude modulation 4-level (PAM4) modulation scheme.

10. A non-transitory computer readable medium storing instructions, which when executed by a processor, cause the processor to simulate or emulate a transmitter, the transmitter comprising:

a multiplexer configured to receive and process an N-bit data stream, wherein N is an even number, the multiplexer comprising:

a set of N pulse generator circuits configured to generate N pulse signals in N different phases of a duty cycle, each of the pulse generator circuits comprising a NAND gate, an inverter, and a NOR gate, wherein the NAND gate receives a data signal and a first clock signal as inputs to generate a first output, the inverter receives a second clock signal as input to generate a second output, the NOR gate receives the first output and the second output as inputs to generate a third output, and the third output is an output of the pulse generator circuit that is received by a driver;

the driver configured to receive the N pulse signals as inputs to output a single-bit data stream, the driver comprising a first set of N transistors and a second set of N/2 transistors, acting as current sources; and an output pad electrically coupled with an output of the driver, serving as an interface between the transmitter and a transmission medium, wherein a gate of each transistor in the first set is configured to receive one of the N pulse signals, a source of each transistor in the second set is electrically coupled with drains of a corresponding pair of transistors in the first set, and drains of the transistors in the second set are electrically coupled with the output pad.

11. The non-transitory computer readable medium of claim 10, wherein the multiplexer is a first multiplexer, the driver is a first driver, the output pad is a first output pad, the N-bit data stream is a first N-bit data stream, and the single-bit data stream is a first single-bit data stream, wherein the non-transitory computer readable medium further stores additional instructions, which when executed by the processor, cause the processor to simulate a second multiplexer identical to the first multiplexer, a second driver identical to the first driver, and a second output pad identical to the first output pad, wherein the second multiplexer is configured to receive and process a second N-bit data stream that is in opposite phase of the first N-bit data stream, and wherein the second driver is configured to output a second single-bit data stream that is in opposite phase of the first single-bit data stream.

12. The non-transitory computer readable medium of claim 10, wherein N is equal to 6 or 8.

13. The non-transitory computer readable medium of claim 10, each of the pulse generator circuits comprising a NAND gate, an inverter, and a NOR gate, wherein:

the NAND gate receives a data signal and a first clock signal as inputs to generate a first output, the inverter receives a second clock signal as input to generate a second output, the NOR gate receives the first output and the second output as inputs to generate a third output, and the third output is an output of the pulse generator circuit that is received by the driver.

14. The non-transitory computer readable medium of claim 13, wherein the third output is a voltage signal, and the driver is a current mode driver configured to convert the voltage signal into a current signal.

15. The non-transitory computer readable medium of claim 10, the transmitter further comprising a clock generator configured to generate N-phase clock signals, each of which is evenly spaced apart in a duty cycle, wherein the N-phase clock signals are input to the multiplexer as timing references for facilitating selecting of one of the N-bit data stream.

16. The non-transitory computer readable medium of claim 15, wherein N is equal to 8, the N-phase clock signals comprise:

a first clock signal at 0 degree;
a second clock signal at 45 degrees;
a third clock signal at 90 degrees;
a fourth clock signal at 135 degrees;
a fifth clock signal at 180 degrees;
a sixth clock signal at 225 degrees;
a seventh clock signal at 270 degrees; and
an eighth clock signal at 315 degrees.

17. The non-transitory computer readable medium of claim 15, the clock generator is configured to generate one of following clock rates: 7 GHz, 14 GHz, 28 GHz, 56 GHz, or 112 GHz.

18. The non-transitory computer readable medium of claim 17, wherein the transmitter is configured to have a serialization rate that is 16 times of a clock rate generated by the clock generator.

19. The non-transitory computer readable medium of claim 10, wherein the N-bit data stream or the single-bit data stream is modulated under pulse amplitude modulation 4-level (PAM4) modulation scheme.

* * * * *